(12) United States Patent
Kim

(10) Patent No.: US 8,072,829 B2
(45) Date of Patent: Dec. 6, 2011

(54) DYNAMIC SEMICONDUCTOR MEMORY WITH IMPROVED REFRESH MECHANISM

(75) Inventor: Yongki Kim, Icheon-Si (KR)

(73) Assignee: Hynix Semiconductor Inc., Ichon-si (KR)

( * ) Notice: Subject to any disclaimer, the term of this patent is extended or adjusted under 35 U.S.C. 154(b) by 0 days.

(21) Appl. No.: 12/940,490

(22) Filed: Nov. 5, 2010

(65) Prior Publication Data

US 2011/0051528 A1    Mar. 3, 2011

Related U.S. Application Data

(60) Division of application No. 11/985,580, filed on Nov. 14, 2007, now Pat. No. 7,869,297, which is a continuation of application No. 11/378,183, filed on Mar. 16, 2006, now Pat. No. 7,313,047.

(60) Provisional application No. 60/776,109, filed on Feb. 23, 2006.

(51) Int. Cl.
*G11C 7/00* (2006.01)
(52) U.S. Cl. .................... 365/222; 365/230.03
(58) Field of Classification Search ............. 365/222, 365/230.03, 233.1, 236
See application file for complete search history.

(56) References Cited

U.S. PATENT DOCUMENTS

| | | | |
|---|---|---|---|
| 4,322,825 A | 3/1982 | Nagami | |
| 5,835,401 A * | 11/1998 | Green et al. | 365/149 |
| 6,005,818 A | 12/1999 | Ferrant | |
| 6,154,409 A | 11/2000 | Huang et al. | |
| 6,195,303 B1 * | 2/2001 | Zheng | 365/222 |
| 6,240,045 B1 | 5/2001 | Haraguchi et al. | |
| 6,282,606 B1 | 8/2001 | Holland | |
| 6,366,515 B2 | 4/2002 | Hidaka | |
| 6,438,016 B1 | 8/2002 | Keeth et al. | |
| 6,445,636 B1 | 9/2002 | Keeth et al. | |
| 6,449,204 B1 * | 9/2002 | Arimoto et al. | 365/222 |
| 6,529,433 B2 | 3/2003 | Choi | |
| 6,584,028 B2 | 6/2003 | Kyung | |
| 6,757,200 B2 | 6/2004 | Keeth et al. | |
| 6,813,211 B2 | 11/2004 | Takatsuka et al. | |
| 6,859,407 B1 | 2/2005 | Suh | |

(Continued)

FOREIGN PATENT DOCUMENTS

CN    1471710 A    1/2004

(Continued)

OTHER PUBLICATIONS

Chinese Office Action for Application No. 200610105992.X, dated Nov. 7, 2008, 9 pages.

(Continued)

*Primary Examiner* — Andy Phung
(74) *Attorney, Agent, or Firm* — Kilpatrick Townsend & Stockton LLP

(57) ABSTRACT

Various embodiments for implementing refresh mechanisms in dynamic semiconductor memories that allow simultaneous read/write and refresh operations. In one embodiment, the invention provides a synchronous multi-bank dynamic memory circuit that employs a flag to indicate a refresh mode of operation wherein refresh operation can occur in the same bank at the same time as normal access for read/write operation. In a specific embodiment, to resolve conflicts between addresses, an address comparator compares the address for normal access to the address for refresh operation. In case of a match between the two addresses, the invention cancels the refresh operation at that array and allows the normal access to proceed.

8 Claims, 6 Drawing Sheets

U.S. PATENT DOCUMENTS

| | | | |
|---|---|---|---|
| 6,859,415 | B2 | 2/2005 | Takatsuka et al. |
| 6,862,238 | B1 | 3/2005 | Lee |
| 6,871,261 | B1 | 3/2005 | Proebsting |
| 6,941,415 | B1 | 9/2005 | Ryan |
| 7,042,785 | B2 * | 5/2006 | Kim ............................ 365/222 |
| 7,088,632 | B2 | 8/2006 | Pelley |
| 7,313,047 | B2 | 12/2007 | Kim |
| 2001/0008496 | A1 | 7/2001 | Leung |
| 2003/0218930 | A1 | 11/2003 | Lehmann et al. |
| 2004/0032772 | A1 | 2/2004 | Takahashi |
| 2008/0137464 | A1 | 6/2008 | Kim |

FOREIGN PATENT DOCUMENTS

| | | | |
|---|---|---|---|
| CN | 1620649 | A | 5/2005 |
| JP | 61-269296 | A | 11/1986 |
| JP | 05-347093 | A | 12/1993 |
| JP | 08-129881 | A | 5/1996 |
| JP | 11-505056 | | 5/1999 |
| JP | 11-250657 | A | 9/1999 |
| JP | 11-312386 | A | 11/1999 |
| JP | 11-339469 | A | 12/1999 |
| JP | 2000-251467 | A | 9/2000 |
| JP | 2002-133865 | A | 5/2002 |
| JP | 2002-304885 | A | 10/2002 |
| JP | 2002-358779 | A | 12/2002 |
| KR | 10-2003-0071783 | A1 | 9/2003 |
| KR | 10-2003-0088026 | A1 | 11/2003 |
| TW | 501134 | B | 9/2002 |
| TW | 571312 | B | 1/2004 |
| WO | WO 97/30453 | A1 | 8/1997 |
| WO | WO 0215194 | A1 | 2/2002 |
| WO | WO 2005/119687 | A2 | 12/2005 |

OTHER PUBLICATIONS

Haeggqwist; "A dynamic memory with simple controls. Hidden refresh for processors"; Elektronik, 1983, pp. 45-46, with 1 page English language abstract, vol. 32, No. 26.

Huang, et al.; "A Low-Voltage Loadless 4N SRAM with Smart Hidden Refresh"; Department of Electronic Engineering Fu-Jen Catholic University, Taiwan, 2003, pp. 251-252.

Miyamoto, et al.; "Improved Address Buffers, TTL Input Current Reduction, and Hidden Refresh Test Mode in a 4-Mb DRAM"; IEEE Journal of Solid State Circuits, 1990, pp. 525-530, vol. 25, No. 2.

Sawada, et al.; "A 30-μ A Data-Retention Pseudostatic RAM with Virtually Statis RAM Mode"; IEEE Journal of Solid-State Circuits, 1998, pp. 12-19, vol. 23, No. 1.

"The 80C186XL/80C188XL Integrated Refresh Control Unit," Intel, (undated) 15 pages.

"Toshiba 1 Mb DRAM sees Silicon"; Integrated Circuits International, 1984, pp. 11-14, vol. 8, No. 9.

Notice of Allowance for U.S. Appl. No. 11/378,183, mailed on Aug. 27, 2007, 9 pages.

Supplemental Notice of Allowance for U.S. Appl. No. 11/378,183, mailed on Oct. 11, 2007, 6 pages.

Requirement for Restriction/Election for U.S. Appl. No. 11/985,580, mailed on Mar. 22, 2010, 5 pages.

Notice of Allowance for U.S. Appl. No. 11/985,580, mailed on Jul. 22, 2010, 18 pages.

* cited by examiner

DYNAMIC SEMICONDUCTOR MEMORY WITH IMPROVED REFRESH MECHANISM

CROSS-REFERENCES TO RELATED APPLICATIONS

This application is a divisional of U.S. application Ser. No. 11/985,580, filed Nov. 14, 2007, now U.S. Pat. No. 7,869,297, issued on Jan. 11, 2011, which is a continuation of U.S. application Ser. No. 11/378,183, filed Mar. 16, 2006, now U.S. Pat. No. 7,313,047, which claims the benefit of U.S. Provisional Application No. 60/776,109, filed Feb. 23, 2006, the disclosures of which are incorporated by reference in their entirety for all purposes.

BACKGROUND OF THE INVENTION

The present invention relates in general to semiconductor memories and in particular to dynamic memory circuits with improved refresh mechanism.

Memory cells in dynamic semiconductor memories such as a dynamic random access memory (DRAM) store data on a capacitive element. Due to charge leakage from the capacitive element memory cells must be refreshed periodically. The refresh process typically involves performing a read operation to bring the level of charge stored in the memory cells back to their original state. Different types of refresh methods have been developed over time. According to one refresh method commonly referred to as auto refresh, the refresh timer is external to the memory chip and the memory chip performs a refresh operation in response to a periodic refresh command supplied by a controller. According to another refresh method referred to as self refresh, the refresh timer is internal to the memory chip and all the memory chip requires is a refresh start command from the controller. Typically, memory cells that are being refreshed are not accessible for normal read and write operations.

With current technology, DRAM memory cells need to be refreshed every 64 ms. This 64 ms refresh period developed as an industry standard and is based on the data retention capability of the DRAM cell technology. Simultaneously refreshing all rows in a typical memory chip will not only cause a big surge in power requirements, it will also cause all data accesses to stall, which adversely impacts performance. To avoid these problems, refresh operations are typically staggered between banks of memory and according to the number of rows in 4096 (4K) or 8192 (8K) cycles. A DRAM being refreshed in 8K cycles, would therefore need a refresh command every 7.8 µs (64 ms/8192). This is commonly referred to as the periodic refresh interval tREFI. The time it takes to complete a single refresh operation after which an active cycle can begin (i.e., minimum time to activate and precharge a word line during a refresh operation), typically referred to as tRFC, is preferably a small fraction of the periodic refresh interval tREFI to maximize the time for normal read and write operation.

This type of multi-bank, time division approach to refreshing DRAMs has thus far been effective in addressing the power and performance tradeoffs associated with the refresh operation. As the memory cell density of DRAM devices increases, however, either longer refresh times or a larger number of refresh operations, or both will be required. This is so because the number of memory cells in a row (or page) that are refreshed simultaneously every tREFI (e.g., 7.8 µs) increases with total memory capacity. For example, a 512M synchronous DRAM with an 8K refresh cycle must refresh a page of 64K (512M/8K) cells simultaneously. This is significantly larger than the typical page size that is activated during normal mode of operation (e.g., 16K for 512M DDR2 DRAM) and presents a heavy power load for the circuit.

One way to address the power management problem associated with the refresh operation in higher density DRAMs is to increase the refresh-to-active cycle time tRFC. A typical refresh-to-active cycle time tRFC for a 256M synchronous DRAM maybe in the range of 75 ns, while tRFC for a 2G synchronous DRAM may reach around 200 ns, and for a 4G DRAM may reach well above 300 ns. Because in a memory bank that is being refreshed, normal memory read/write operations are not allowed during tRFC, longer tRFC reduces time available to the controller for accessing the DRAM. This adversely impacts DRAM performance by reducing the amount of time available for normal read/write operation.

Thus, as the memory cell density increases in dynamic semiconductor memories, the need arises for improved refresh mechanisms that address power requirements without sacrificing time available for normal read/write operations.

BRIEF SUMMARY OF THE INVENTION

The present invention provides various embodiments for implementing refresh mechanisms in dynamic semiconductor memories that allow simultaneous read/write and refresh operations. In one embodiment, the invention provides a synchronous dynamic memory circuit that employs a flag to indicate a refresh mode of operation wherein refresh operation can occur in the same bank at the same time as normal access for read/write operation. In a specific embodiment, to resolve conflicts between addresses, an address comparator compares the address for normal access to the address for refresh operation. In case of a match between the two addresses, the invention cancels the refresh operation at that array and allows the normal access to proceed. According to this embodiment, the internal pre-charge pulse at the end of a refresh cycle is suppressed in order to accommodate memory access to the same location. Pre-charge is instead performed by a pre-charge signal associated with the active (as opposed to refresh) cycle. For those memory circuits that provide self and/or auto refresh operations, the hidden refresh flag provides a mechanism to distinguish between the different modes of refresh.

Accordingly, in one embodiment, the present invention provides a synchronous dynamic memory circuit that includes: a plurality of memory banks each having a plurality of memory cells, a command decoder responsive to a command input signal indicating a mode of operation, an address decoder responsive to an address input signal indicating a memory cell location, and a refresh controller responsive to a hidden refresh signal, wherein in response to the hidden refresh signal the refresh controller initiates a refresh operation that can proceed at the same time as a normal read/write operation, and wherein the refresh operation and the normal read/write operation occur in response to a periodic clock signal. According to this embodiment, the normal read/write operation and the refresh operation can occur at the same time in the same one of the plurality of memory banks. The memory circuit further includes an address comparator that compares a refresh address to a normal read/write address and generates an address conflict signal in case of an address conflict, whereby the refresh controller cancels the refresh operation in response to the address conflict signal allowing the normal read/write operation to proceed. Further, refresh controller may be additionally responsive to a normal refresh signal to initiate a normal refresh operation during which a normal read/write operation cannot be performed.

In another embodiment, the present invention provides a method of operating a synchronous dynamic memory circuit that includes: entering a normal access mode of operation whereby a memory cell in any one of a plurality of memory banks is accessed for a read or write operation in accordance with a periodic clock signal, and entering a hidden refresh mode of operation whereby a memory cell in any one of the plurality of memory banks is refreshed in accordance with the periodic clock signal, wherein the normal access mode and the hidden refresh mode can occur at the same time. According to this embodiment, the normal access mode and the refresh access mode can occur at the same time and within the same memory bank. The method may further include entering a normal refresh mode of operation whereby a memory cell in any one of the plurality of memory banks is refreshed, and wherein during the normal refresh mode the memory circuit may not enter the normal access mode.

In yet another embodiment, the present invention provides a synchronous dynamic memory circuit that includes: a plurality of memory banks each having a plurality of memory cells, a command decoder responsive to a command input signal indicating a mode of operation, an address decoder responsive to an address input signal indicating a memory cell location, an address comparator that compares a refresh address to a normal read/write address and generates an address conflict signal in case of an address conflict, and a refresh controller responsive to a hidden refresh signal, wherein in response to the address conflict signal, the controller suppresses an internal pre-charge pulse associated with the refresh operation. According to this embodiment, the normal read/write operation and the refresh operation can occur at the same time in the same one of the plurality of memory banks.

In another embodiment, the present invention provides a method of operating a synchronous dynamic memory circuit that includes: entering a normal access mode of operation whereby a memory cell in any one of a plurality of memory banks is accessed for a read or write operation in accordance with a periodic clock signal, entering a hidden refresh mode of operation whereby a memory cell in any one of the plurality of memory banks is refreshed in accordance with the periodic clock signal, comparing a first memory address in the normal access mode to a second memory address in the hidden refresh mode, and suppressing a pre-charge signal associated with the hidden refresh mode in case of a conflict between the first memory address and the second memory address, wherein the normal access mode and the hidden refresh mode can occur at the same time and within the same memory bank. The method further includes performing a pre-charge operation by a pre-charge signal associated with the normal access mode in case of a conflict between the first memory address and the second memory address.

A better understanding of the nature and advantages of the present invention will be gained with reference to the detailed description below and the accompanying drawings.

DETAILED DESCRIPTION OF THE INVENTION

Various embodiments of the present invention provide memory circuits with improved refresh functionality as well as methods of operating such memory circuits. According to one embodiment, the present invention provides a multi-bank, synchronous dynamic memory circuit that in response to a special refresh command, referred to herein as hidden refresh, initiates a refresh operation that can proceed at the same time as normal read or write operation. It is to be understood that the language "at the same time" or "simultaneous" as used herein throughout is meant to cover conditions where there is overlap in time between the two operations and does not require, although allows for, the two operations to start and/or end at the same time.

Figure 1:
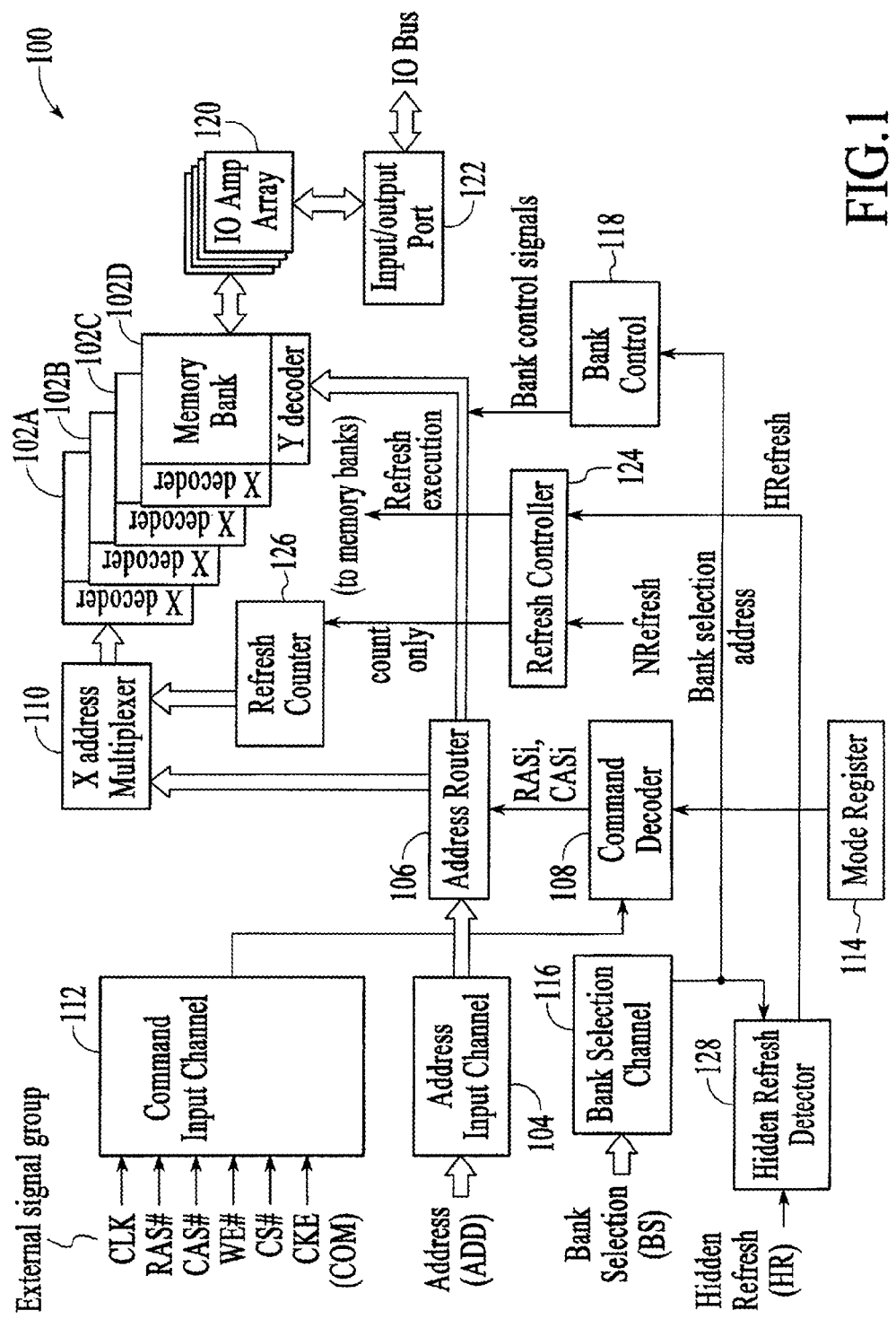
FIG. 1 shows an example of a simplified block diagram for a multi-bank synchronous dynamic memory circuit according to one embodiment of the present invention.

Referring to FIG. 1, there is shown an example of a simplified block diagram for a multi-bank, synchronous dynamic memory circuit 100 according to one embodiment of the present invention. In this example, memory circuit 100 includes four memory banks 102A, 102B, 102C and 102D that can be independently accessed for normal read and write operations. It is to be understood that the inventive concept as described herein can apply to memory circuits organized in different numbers of memory banks as well. Memory banks 102 include a plurality of memory cells arranged at intersections of word lines and bit lines, as well as bit line sense amplifiers, bit line precharge and column select circuitry. Each memory bank 102 has an X decoder and a Y decoder for decoding row and column memory addresses, respectively. An address input channel 104 receives external addresses from a controller (not shown) and supplies the address to an address router 106. Responsive to specific commands generated by a command decoder 108, address router 106 supplies row addresses to a row address multiplexer 110, and column addresses to the Y decoders in memory banks 102. Command decoder 108 receives various external memory commands from a command input channel 112 and decodes those commands that control various operational aspects of the memory circuit. Command decoder 108 may also receive control information from an internal mode register 114 that stores control data. A bank selection channel 116 receives external bank selection signal and generates bank select addresses that are supplied to a bank control block 118. Bank control block 118 generates bank control signals that are supplied to memory banks 102 to select any one or more of the plurality of banks for a given operation. Each memory bank has I/O amplifiers that collectively form an array of I/O amplifiers 120. Data is transferred between the memory banks and the I/O pins through an I/O port 122. Command input channel 112, address input channel 104 and bank selection channel 116 include circuitry such as input buffers to process the signals they receive.

The refresh operation is controlled by a refresh controller 124. Refresh controller 124 receives a normal refresh signal NRefresh as well as a hidden refresh signal HRefresh. The normal refresh signal NRefresh indicates one of either auto or self refresh modes of operation triggered by the controller. The hidden refresh signal HRefresh is generated, in this exemplary embodiment, by a hidden refresh detector 128 that receives an external hidden refresh command or flag HR and the bank selection signal from the bank selection channel 116. In an alternative embodiment, hidden refresh command is stored in mode register 114 and is decoded by command decoder 108 and then supplied to refresh controller 124. In response to the NRefresh and HRefresh signals, refresh controller 124 generates the appropriate refresh control signal and supplies the refresh control signal to a refresh counter 126. Refresh counter 126 generates row addresses for the refresh operation. Row address multiplexer 110 receives the internally generated row addresses from refresh counter 126 and selectively applies the row addresses from refresh counter 126 to the memory banks 102. As will be further described below, during a normal refresh cycle triggered by NRefresh, memory rows from all banks are simultaneously refreshed and memory banks 102 are not available for normal read and write operations. However, during a hidden refresh cycle triggered by HRefresh, all memory banks 102 can be accessed for normal read or write operations. Hidden refresh can occur independent of which bank may be accessed simultaneously for read or write operation.

The relevant operational aspects of memory circuit 100 will be described hereinafter. The overall operation of memory circuit 100 is under the control of a memory controller (not shown) that supplies memory circuit 100 with various command signals such as RAS# (row address strobe), CAS# (column address strobe), WE# (write enable) and CS# (chip select). It is the combination of these signals that indicates a read, write or another type of command (COM) that dictates a given operation for the memory circuit. The operation of memory circuit 100 is synchronized by an externally received periodic clock signal CLK.

Figure 2:
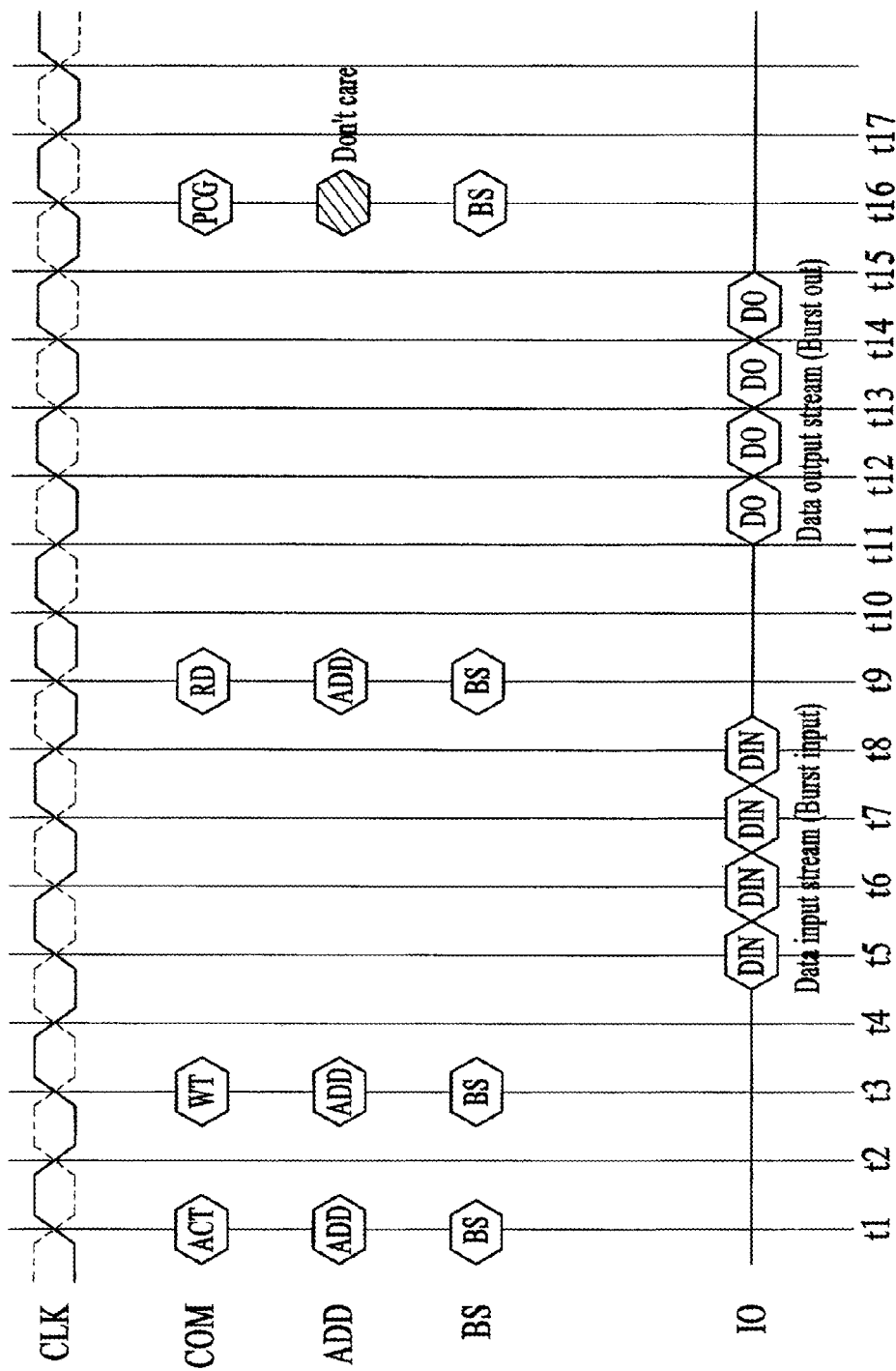
FIG. 2 is a timing diagram illustrating normal read and write mode of operation for a synchronous dynamic memory circuit.

FIG. 2 is a timing diagram illustrating typical read and write operations for memory circuit 100. The clock signal CLK controls the timing of all memory operations. In the example shown in FIG. 2, at time t1, memory circuit 100 receives command ACT signaling the start of an active cycle, address signals ADD and bank select signal BS. After one clock period, at time t3 a write operation starts with a write command WT at the given address ADD within a bank selected by BS. A stream of input data is received at the memory I/O pins at times t4 through t8 as shown, and written in the address locations. At time t9, memory circuit 100 receives a read command RD along with a new address ADD and bank select signal BS. The read operation is performed and the data is read from the location indicated by ADD in the bank selected by BS, and then supplied to the output at times T11 to t15. At the end of the active cycle, a precharge command PCG precharges the selected bank for the next operation.

Figure 3:
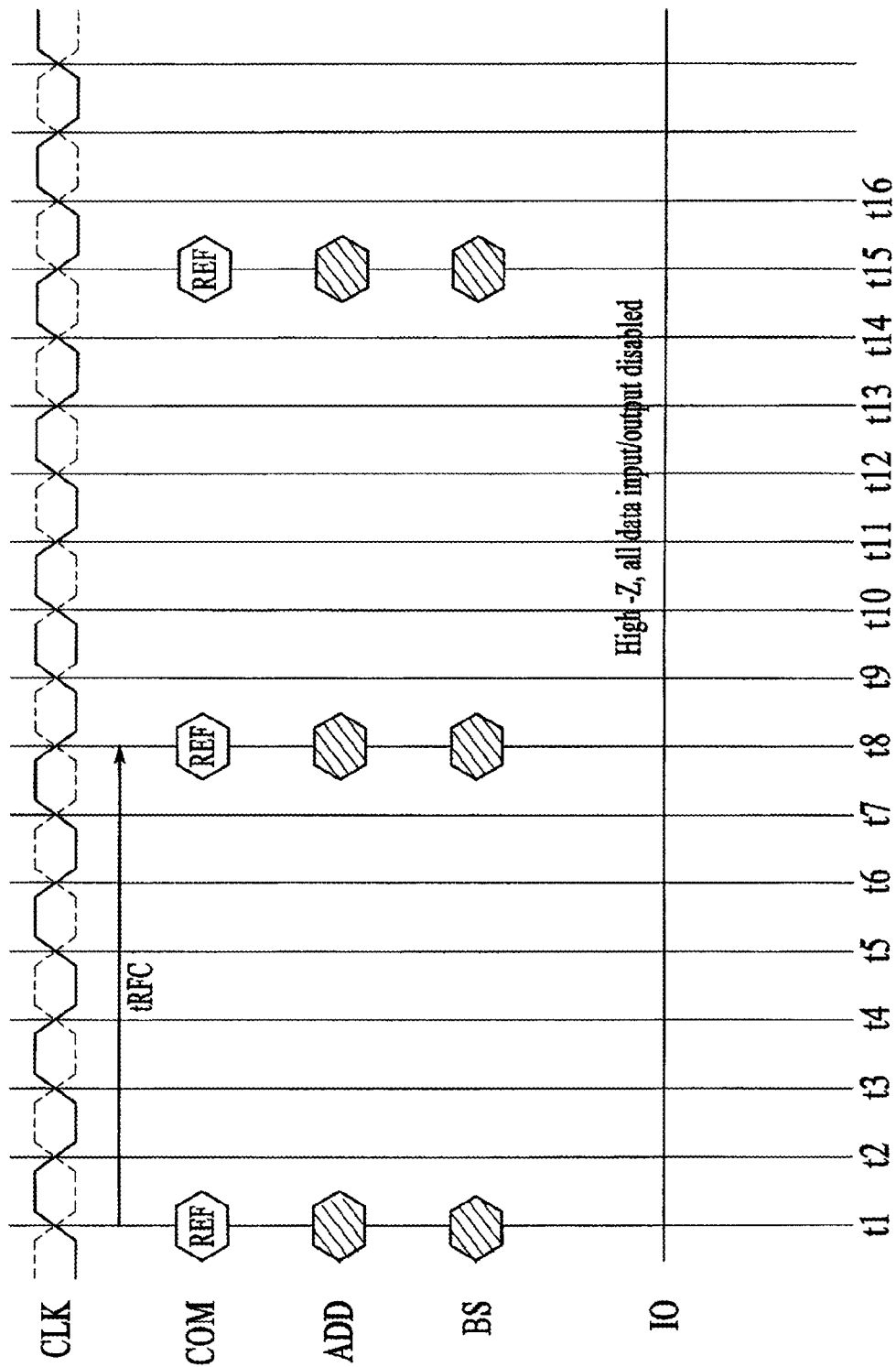
FIG. 3 is a timing diagram illustrating normal refresh operation for a synchronous dynamic memory circuit.

The timing diagram shown in FIG. 3 illustrates a normal refresh operation. At time t1 of the clock signal CLK, a normal refresh command REF is received by memory circuit 100. Refresh controller 124 initiates the normal refresh operation and a row in each memory bank 102 is refreshed. The time it takes to complete a single refresh operation is indicated by tRFC. After one tRFC, at time t8, a second refresh command starts the next refresh operation. As indicated in the timing diagram of FIG. 3, both address ADD and bank select BS signals are in a "don't care" state since during normal refresh the refresh controller sweeps through all banks. Also, note that all data input/output are driven to a high impedance (or High Z) state and disabled since no normal read or write access to the memory banks is allowed during normal refresh.

Figure 4:
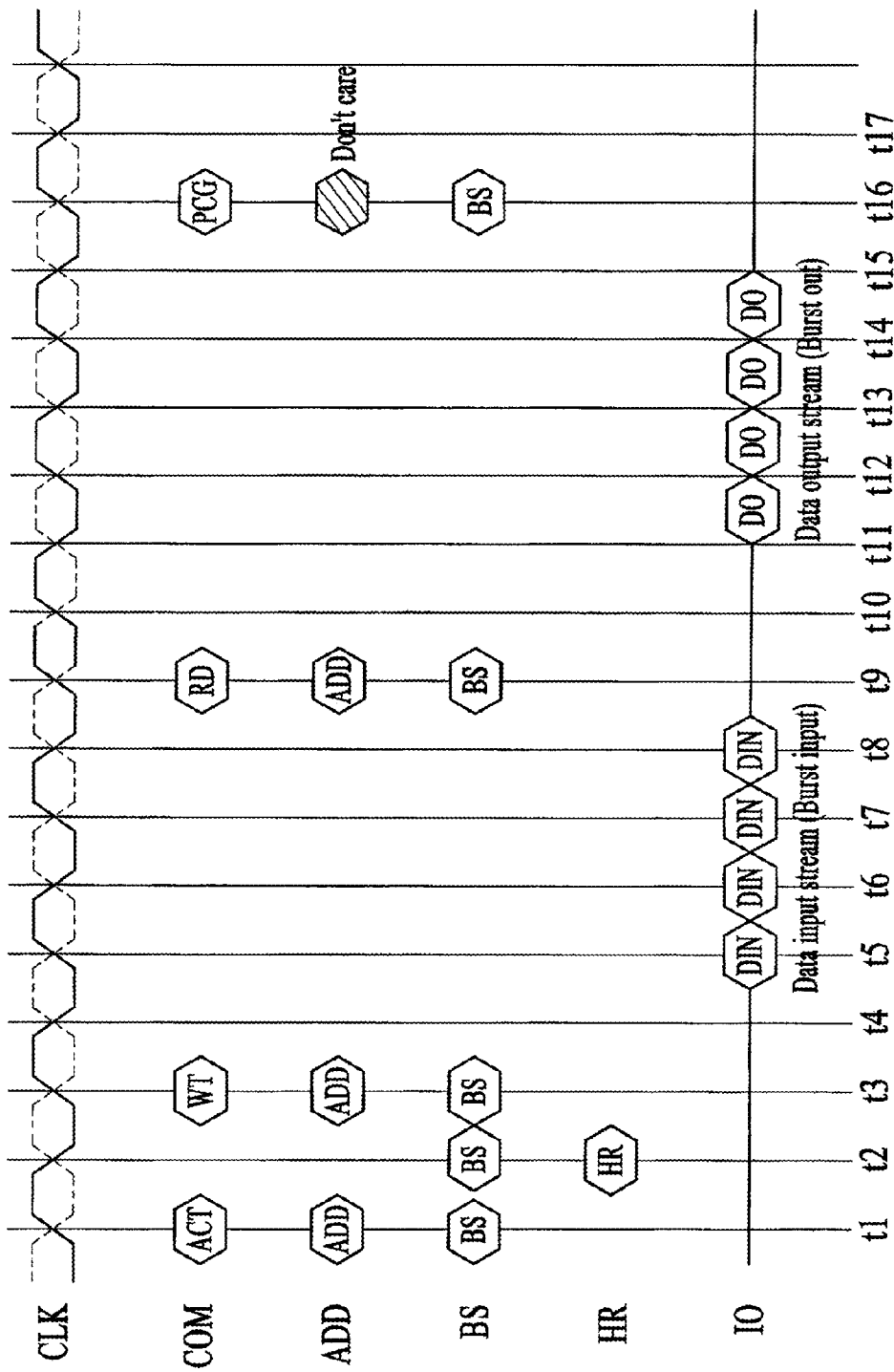
FIG. 4 is a timing diagram illustrating hidden refresh operation for a synchronous dynamic memory circuit according to the present invention.

FIG. 4 is a timing diagram illustrating the hidden refresh operation of memory circuit 100 according to one embodiment of the present invention. Referring to FIG. 4, at time t1, an active command ACT initiates a write operation at the address given by ADD and BS. Data is written into a selected bank and read out of a selected bank according to normal read/write operation as described in connection with the timing diagram in FIG. 2. A hidden refresh operation can be initiated at time t2 and rows in any bank selected by the bank select signal BS at time t2 can be refreshed while the normal write (or read) operation is in progress. In this embodiment, to allow hidden refresh to occur in any bank (i.e., having its own BS signal), hidden refresh is initiated at any clock other than the active, read or write clocks. In an alternative embodiment, a separate bank select signal that is dedicated to the hidden refresh operation, HRBS, can be provided to the memory circuit to allow initiating a hidden refresh at any clock including the active, read or write clocks. In yet another alternative embodiment, during hidden refresh, rows in all memory banks can be refreshed simultaneously removing the need for a BS signal.

Figure 5:
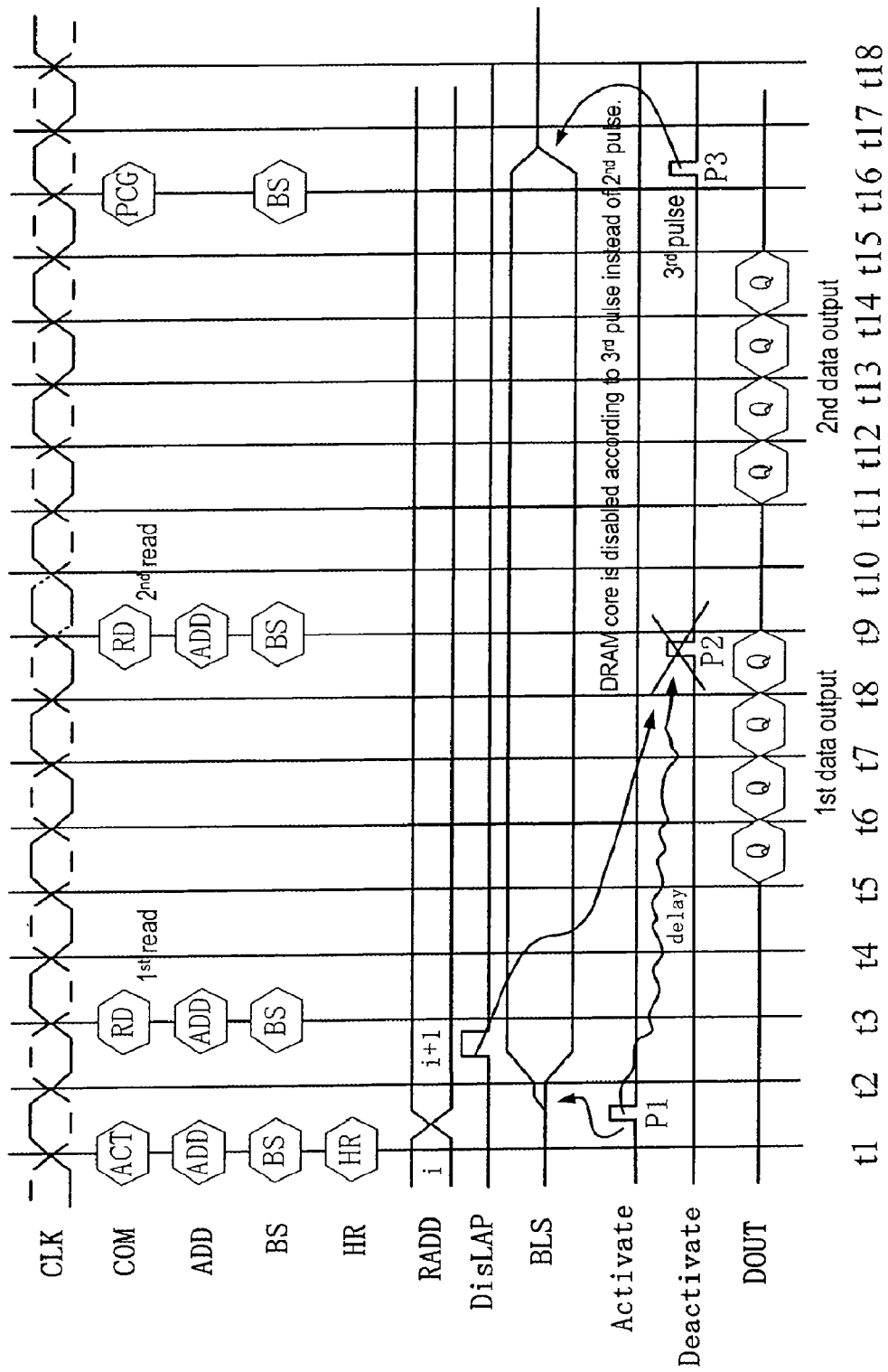
FIG. 5 is a timing diagram illustrating a hidden refresh operation in case of a synchronous dynamic memory circuit where RAS cycle time for normal access is greater than the hidden refresh cycle time.

Because according to the present invention hidden refresh and normal read or write operations can occur at the same time, the possibility exists that at any given time the hidden refresh address and the normal access address may be the same. In case of such address conflict, an embodiment of the present invention ensures that the normal access operation proceeds without error and without corruption of the read or write data. Referring to FIG. 5, there is shown a timing diagram illustrating the potential problem caused by such address conflict and one solution to the problem according to one embodiment of the present invention. The timing diagram of FIG. 5 shows two consecutive read operations during which a hidden refresh operation is in progress. The signal RADD refers to the refresh address (in this case hidden refresh) that is generated by the internal refresh counter. A first pulse P1 occurs some time after time t1 which activates the DRAM core allowing a potential difference to developed on the bit lines BLS. This potential difference reflects the contents of the addressed memory cells. The data resulting from the first read operation is output at DOUT starting at time t5. Assume the refresh address RADD and the read address are the same such that the same memory location is being accessed for both refresh and normal read operation. If for this DRAM the refresh cycle time tRFC is shorter than the normal (RAS) active cycle time tRC, then a second pulse P2 is generated by the refresh logic to signal the internal automatic precharge for the refresh cycle before the second read operation. Under this circumstance the second read operation cannot complete properly since the DRAM core is disabled by the internal refresh precharge signal. To avoid the possibility of such conflict, this embodiment of the present invention cancels or suppresses the premature internal automatic precharge pulse P2 by a disable signal DisIAP. The DRAM core remains active allowing proper completion of the second read operation, after which an external precharge command generates pulse P3.

Figure 6:
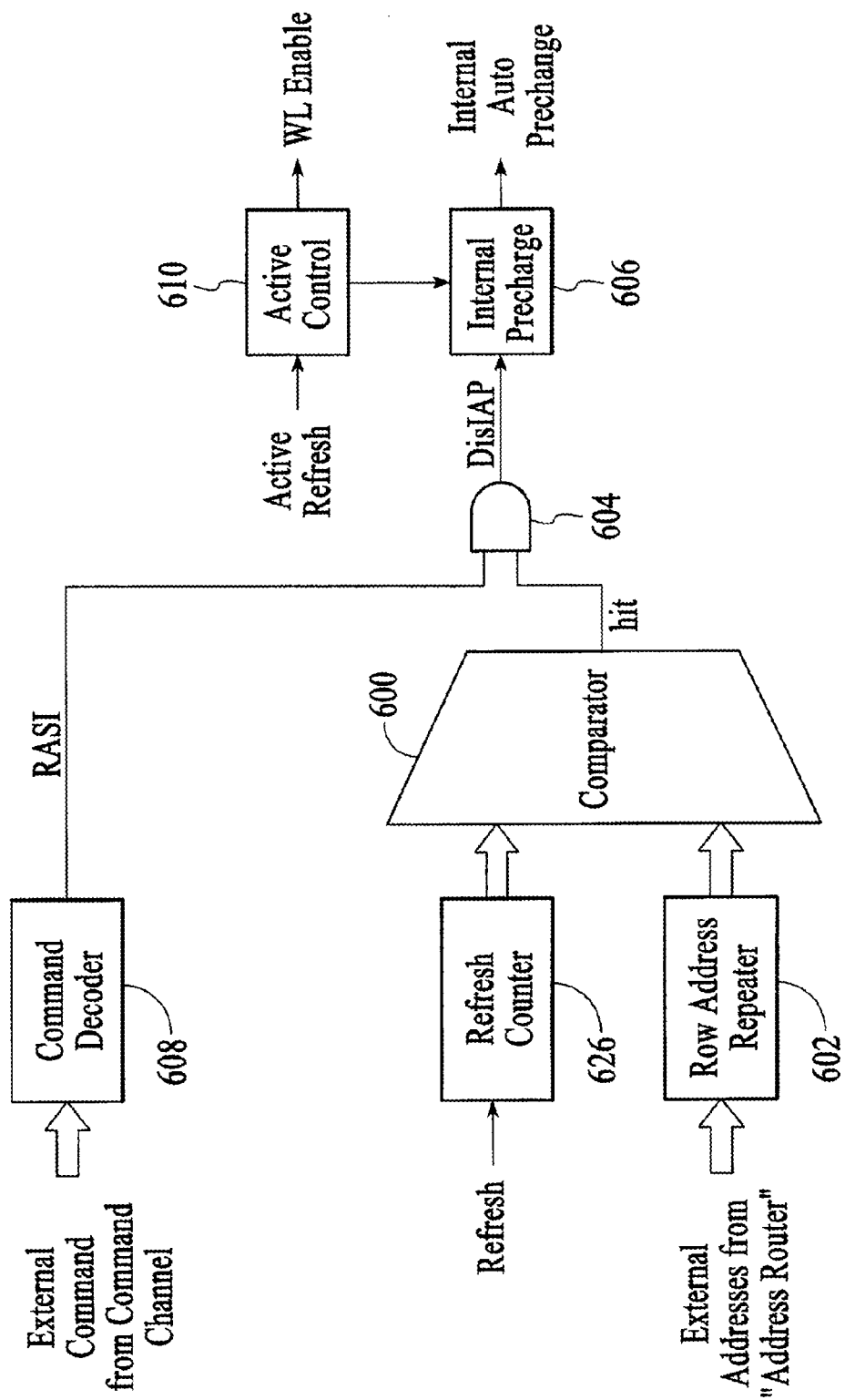
FIG. 6 is a simplified block diagram showing a part of a synchronous dynamic memory circuit that resolves potential address conflicts during simultaneous normal access and hidden refresh operations.

According to one embodiment of the present invention, refresh controller 124 includes address compare circuitry to detect such address conflicts and to disable any premature automatic precharge signals associated with the hidden refresh operation. Referring to FIG. 6 there is shown a simplified block diagram showing a part of memory circuit 100 with refresh inhibit logic that resolves potential address conflicts during simultaneous normal access and hidden refresh operations. A comparator 600 receives the refresh address (RADD in FIG. 5) from refresh counter 626 at one input and the external read (or write) address ADD from a row address repeater 602 at another input. The output of comparator 600 is applied to one input of a logic circuit 604, while a second input of logic circuit 604 receives a RAS-derived signal RASI that indicates start of a DRAM core activation cycle. The signal RASI may correspond to the first pulse P1 in FIG. 5. The output of logic circuit 604 generates the disable signal DisIAP that is applied to an internal precharge circuit 606. Internal precharge circuit 606 generates the internal auto precharge signal (second pulse P2 in FIG. 5) in response to active control logic 610. Active control logic 610 includes circuitry that monitors the delay corresponding to the cycle duration for generating the second pulse and controls word line enable and sense amplifier enable signals for the memory core.

In operation, as long as the refresh address RADD and external address ADD are different, logic circuit 604 does not disable internal precharge circuit 606. That allows hidden refresh and normal access operations to proceed simultaneously. If the two addresses RADD and ADD are the same, comparator 600 generates a "hit" signal indicating an address conflict. Logic circuit 604 generates a disable signal in response to the "hit" signal disabling the internal auto precharge pulse (P2 in FIG. 5). The DRAM core is instead disabled and prechared in response to an external precharge command as illustrated in the timing diagram of FIG. 5. Accordingly, the circuit of FIG. 6 provides one exemplary implementation for resolving the potential problems caused by a conflict between a refresh address and a normal access address.

The present invention thus provides various embodiments for improved refresh mechanism whereby memory cells can be refreshed during normal read or write operations without adversely impacting DRAM performance or power requirements. While the above provides a complete description of specific embodiments that are illustrative of the present invention, it is possible to use various alternatives, modifications and equivalents. For example, those skilled in the art appreciate that the address conflict resolution scheme described in connection with FIG. 6 can be employed in the context of any type of refresh operation whether considered hidden or otherwise. Also, as dynamic memory technology migrates to newer generations, there may not be a need for the memory device to support multiple different refresh modes of operation (e.g., auto, self, hidden, etc.), wherein the refresh mechanism described herein becomes the only preferred method of refresh. In that case, detection circuitry to distinguish between different refresh modes of operation will not be necessary. Therefore, the scope of the present invention should not be limited to the specific and illustrative embodiments described above, and should instead be determined with reference to the appended claims along with their full scope of equivalents.

What is claimed is:

1. A circuit that enables simultaneous normal access and hidden refresh operations in the same bank of a multi-bank memory; the circuit comprising:
   a refresh address circuit configured to supply a refresh address signal;
   a normal address circuit configured to supply a normal address signal;
   a comparator coupled to receive the refresh address signal at a first input and the normal address signal at a second input, and configured to generate an address conflict signal;
   a memory cycle control circuit configured to generate a memory cycle activation pulse; and
   a logic circuit coupled to receive the address conflict signal from the comparator, and to supply a disable signal to the memory cycle control circuit,
   wherein, in case of an address conflict, the disable signal inhibits the memory cycle control circuit from generating the memory cycle activation pulse.

2. The circuit of claim 1 wherein the memory cycle control circuit comprises an internal precharge circuit configured to generate the memory cycle activation pulse.

3. The circuit of claim 2 wherein the memory cycle control circuit further comprises an activation control logic coupled to the internal precharge circuit, the activation control logic being configured to monitor delay corresponding to memory cycle duration.

4. The circuit of claim 3 wherein the activation control logic further comprises circuitry to generate word line enable signal for memory operation.

5. The circuit of claim 1 wherein the logic circuit is coupled to receive a memory activation signal.

6. The circuit of claim 5 wherein the memory activation signal is derived from an external row address strobe signal.

7. The circuit of claim 1 wherein the refresh address circuit comprises a refresh counter that is coupled to generate an internal refresh address signal.

8. The circuit of claim 1 wherein the normal address circuit is a row address repeater that is coupled to receive an external row address signal.

* * * * *